US012782428B2

(12) United States Patent
Kao et al.

(10) Patent No.: US 12,782,428 B2
(45) Date of Patent: Nov. 3, 2026

(54) CORRECTION SYSTEM AND METHOD FOR SEMICONDUCTOR CIRCUIT

(71) Applicant: Realtek Semiconductor Corporation, Hsinchu (TW)

(72) Inventors: Li-Lung Kao, Hsinchu (TW); Chia-Chi Tsai, Hsinchu (TW); Pei-Chun Liao, Hsinchu (TW); Kai-Yi Huang, Hsinchu (TW); Sin Hua Wu, Hsinchu (TW)

(73) Assignee: Realtek Semiconductor Corporation, Hsinchu (TW)

( * ) Notice: Subject to any disclaimer, the term of this patent is extended or adjusted under 35 U.S.C. 154(b) by 239 days.

(21) Appl. No.: 18/671,982

(22) Filed: May 22, 2024

(65) Prior Publication Data

US 2025/0085336 A1 Mar. 13, 2025

(30) Foreign Application Priority Data

Sep. 12, 2023 (TW) ................................. 112134693

(51) Int. Cl.
*H03K 17/16* (2006.01)
*G01R 29/26* (2006.01)
*G01R 31/28* (2006.01)

(52) U.S. Cl.
CPC ....... *G01R 31/2884* (2013.01); *H03K 17/165* (2013.01)

(58) Field of Classification Search
CPC .......................... G01R 31/2884; H03K 17/165
See application file for complete search history.

(56) References Cited

U.S. PATENT DOCUMENTS

| | | | | |
|---|---|---|---|---|
| 8,513,102 | B2 | 8/2013 | Forbes et al. | |
| 2014/0269867 | A1* | 9/2014 | Meller | H04B 3/46 375/224 |
| 2018/0301977 | A1* | 10/2018 | Yamada | H03K 17/166 |
| 2020/0191849 | A1* | 6/2020 | Pereira | H03K 5/1252 |

* cited by examiner

*Primary Examiner* — Alesa Allgood
(74) *Attorney, Agent, or Firm* — CKC & Partners Co., LLC

(57) ABSTRACT

The present disclosure provides a correction system and method for correcting a semiconductor circuit. The correction system includes a plurality of redundant circuit units, a plurality of switching circuit units and a control circuit. The redundant circuit units are coupled to the semiconductor circuit. The switching circuit units are coupled to the redundant circuit units and a plurality of basic circuit units of the semiconductor circuit. The control circuit is coupled to the semiconductor circuit and the switching circuit units, is configured to obtain a noise signal of the semiconductor circuit, is configured to determine whether the semiconductor circuit passes a noise test by recognizing a characteristic of the noise signal, and is configured to replace one of the basic circuit units with one of the redundant circuit units by controlling the switching circuit units when the semiconductor circuit does not pass the noise test.

20 Claims, 5 Drawing Sheets

CORRECTION SYSTEM AND METHOD FOR SEMICONDUCTOR CIRCUIT

CROSS-REFERENCE TO RELATED APPLICATION

This application claims priority to Taiwan Application Serial Number 112134693, filed Sep. 12, 2023, which is herein incorporated by reference in its entirety.

BACKGROUND

Field of Invention

This disclosure relates to a system and method, and in particular to a correction system and method for correcting semiconductor circuit.

Description of Related Art

With the development of the semiconductor technologies, transistors and/or integrated circuits using transistors may have problem of reduced performance due to the existence of random telegraph noise (RTN). Therefore, it is necessary to improve this.

SUMMARY

An aspect of present disclosure relates to a correction system. The correction system is configured to correct a semiconductor circuit, and includes a plurality of redundant circuit units, a plurality of switching circuit units and a control circuit. The plurality of redundant circuit units are coupled to the semiconductor circuit. The plurality of switching circuit units are coupled to the plurality of redundant circuit units and a plurality of basic circuit units of the semiconductor circuit. The control circuit is coupled to the semiconductor circuit and the plurality of switching circuit units, is configured to obtain a noise signal of the semiconductor circuit, is configured to determine whether the semiconductor circuit passes a noise test by recognizing a characteristic of the noise signal, and is configured to replace one of the plurality of basic circuit units with one of the plurality of redundant circuit units by controlling the plurality of switching circuit units when the semiconductor circuit does not pass the noise test.

Another aspect of present disclosure relates to a correction method. The correction method is configured to correct a semiconductor circuit, wherein the semiconductor circuit includes a plurality of basic circuit units, a plurality of redundant circuit units is coupled to the semiconductor circuit, a plurality of switching circuit units is coupled to the plurality of basic circuit units and the plurality of redundant circuit units, and the correction method includes: obtaining a noise signal of the semiconductor circuit; determining whether the semiconductor circuit passes a noise test by recognizing a characteristic of the noise signal; and replacing one of the plurality of basic circuit units with one of the plurality of redundant circuit units by controlling the plurality of switching circuit units when the semiconductor circuit does not pass the noise test.

In sum, by arranging the redundant circuit units and the switching circuit units in the semiconductor circuit, the correction system and the correction method of the present disclosure can replace the basic circuit unit having the problem of the random telegraph noise with the redundant circuit unit, so as to have advantages of improving the performance of the semiconductor circuit.

DETAILED DESCRIPTION

Figure 1:
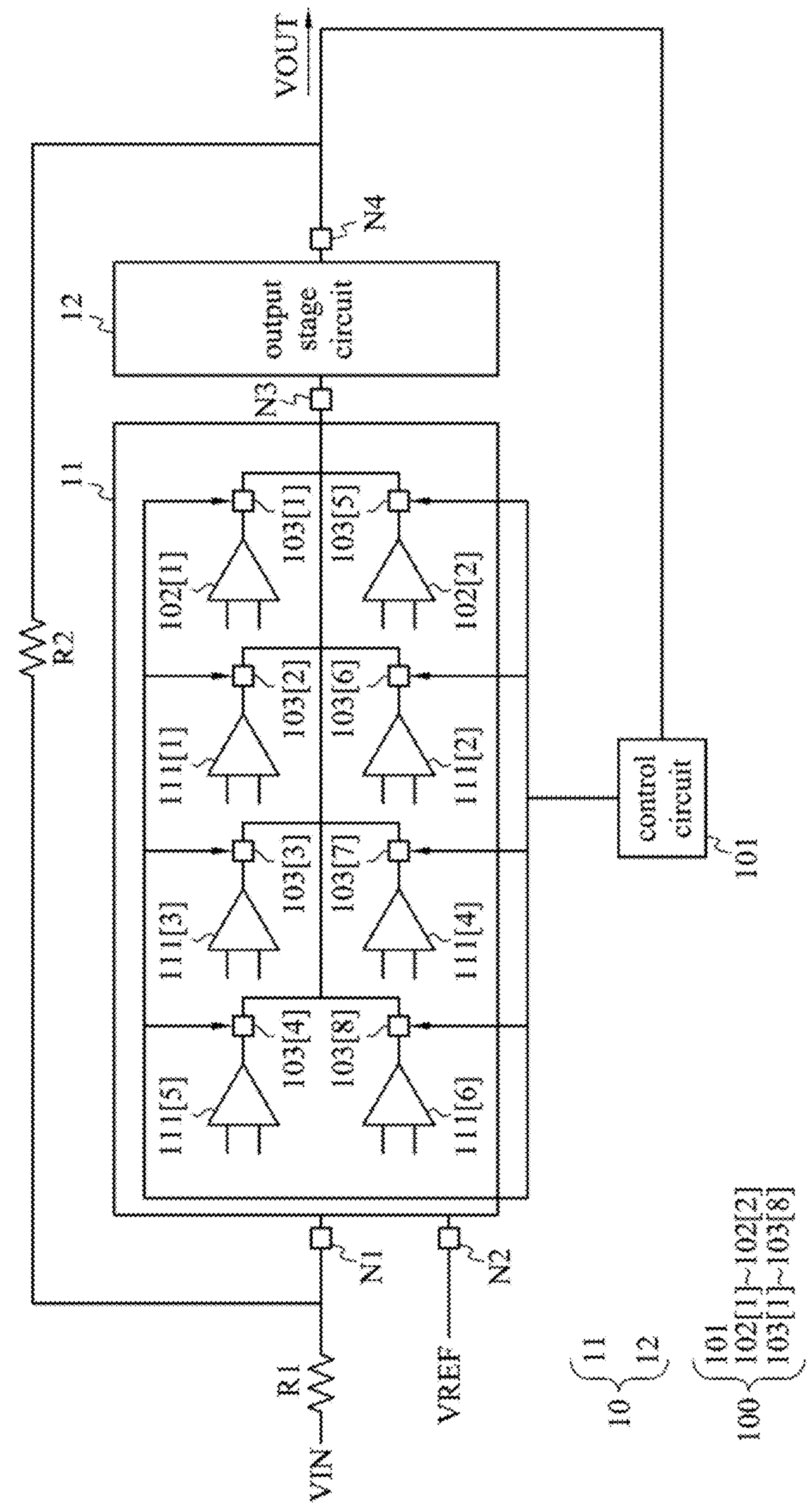
FIG. 1 is a schematic diagram of a correction system and a semiconductor circuit in accordance with some related arts.

The embodiments are described in detail below with reference to the appended drawings to better understand the aspects of the present disclosure. However, the provided embodiments are not intended to limit the scope of the disclosure, and the description of the structural operation is not intended to limit the order in which they are performed. Any device that has been recombined by components and produces an equivalent function is within the scope covered by the disclosure.

The terms used in the entire specification and the scope of the patent application, unless otherwise specified, generally have the ordinary meaning of each term used in the field, the content disclosed herein, and the particular content.

The terms "coupled" or "connected" as used herein may mean that two or more elements are directly in physical or electrical contact, or are indirectly in physical or electrical contact with each other. It can also mean that two or more elements interact with each other.

In the following embodiments, if the reference character of component or signal is used without specifying the numerical index, it represents that reference character of component or signal is referred to anyone in belonged component group or signal group. For example, the basic circuit unit 111 is referred to non-specific one or more of the basic circuit units 111[1]-111[6].

In some related arts, transistor might have some crystal defects existing on interior or junction of its oxide layer due to some manufacturing processes (e.g., heavy ion implantation, surface contamination, etc.). These crystal defects would lead to random trap and random detrap of some charge carriers in channels, so as to significantly affect the transistor. For example, the operating current of the transistor may be disturbed. In particular, because the disturbance in the operating current has characteristic similar to random telegraph signal (RTS), this disturbance in the operating current is usually regarded as random telegraph noise (RTN).

Referring to FIG. 1, FIG. 1 is a schematic diagram of a semiconductor circuit 10 and a correction system 100 in accordance with some related arts. In some embodiments, the semiconductor circuit 10 is implemented with a circuit composed of one or more transistors. In accordance with the aforementioned descriptions of the related arts, the semiconductor circuit 10 is likely to have a problem of reduced performance due to the existence of the random telegraph noise. Accordingly, it is required to test and/or check the semiconductor circuit 10, so as to be aware if the random telegraph noise exists in the semiconductor circuit 10. In some embodiments, when the random telegraph noise exists in the semiconductor circuit 10, the correction system 100 can correct the semiconductor circuit 10, to prevent the performance of the semiconductor circuit 10 from being affected.

In some embodiments, the semiconductor circuit 10 is an operational amplifier. In particular, as shown in FIG. 1, the semiconductor circuit 10 includes a first stage circuit 11 and an output stage circuit 12. Since the first stage circuit 11 is directly related to noise (e.g., the aforementioned random telegraph noise), the correction system 100 is configured to correct the semiconductor circuit 10 by correcting the first stage circuit 11.

In accordance with the aforementioned descriptions related to correcting the first stage circuit 11, in the embodiments of FIG. 1, the first stage circuit 11 is provided with a plurality of basic circuit units 111[1]-111[6], and the correction system 100 includes a control circuit 101, a plurality of redundant circuit units 102[1]-102[2] and a plurality of switching circuit units 103[1]-103[8]. The redundant circuit units 102[1]-102[2] are arranged on the first stage circuit 11 in the semiconductor circuit 10. The switching circuit units 103[1]-103[8] are also arranged on the first stage circuit 11 in the semiconductor circuit 10, to be coupled to the redundant circuit units 102[1]-102[2] and the basic circuit units 111 [1]-111 [6], respectively. In addition, the control circuit 101 is coupled to the switching circuit units 103[1]-103[8], to control the switching circuit units 103[1]-103[8]. It can be seen that the redundant circuit units 102[1]-102[2] of the correction system 100 are coupled to the semiconductor circuit 10.

In some further embodiments, as shown in FIG. 1, the amount of the redundant circuit units 102 is less than the amount of the basic circuit units 111, and the amount of the switching circuit units 103 is equal to a sum of the amount of the redundant circuit units 102 and the amount of the basic circuit units 111. It should be understood that the amount of the redundant circuit units 102, the amount of the switching circuit units 103 and the amount of the basic circuit units 111 are not limited to the amounts as shown in FIG. 1.

In the embodiments of FIG. 1, the first stage circuit 11 is coupled to a resistor R1 at a node N1 (e.g., an inverting input terminal of the first stage circuit 11), to receive an input signal VIN through the resistor R1. The first stage circuit 11 is configured to receive a reference signal VREF (e.g., ground signal) through a node N2 (e.g., a non-inverting input terminal of the first stage circuit 11). The first stage circuit 11 is coupled to the output stage circuit 12 at a node N3 (that is, the node N3 is an output terminal of the first stage circuit 11 or an input terminal of the output stage circuit 12). The output stage circuit 12 is coupled to a resistor R2 at a node N4 (e.g., an output terminal of the output stage circuit 12), and the resistor R2 is coupled between the node N1 and the node N4, so as to form a negative feedback path.

In can be seen from the above descriptions that the resistor R1 is coupled between the inverting input terminal of the first stage circuit 11 and the input signal VIN. The non-inverting input terminal of the first stage circuit 11 is coupled to the reference signal VREF. The output terminal of the first stage circuit 11 is coupled to the input terminal of the output stage circuit 12. The resistor R2 is coupled between the inverting input terminal of the first stage circuit 11 and the output terminal of the output stage circuit 12, so that the output terminal of the output stage circuit 12 is coupled to the inverting input terminal of the first stage circuit 11.

It should be understood that when the semiconductor circuit 10 is implemented with the operational amplifier, as shown in FIG. 1, the connection of the semiconductor circuit 10 with the resistor R1 and the resistor R2 composes an inverting amplifier. Accordingly, the semiconductor circuit 10 can generate an output signal VOUT according to the input signal VIN. For example, the output signal VOUT can be generated by amplifying the input signal VIN.

In some embodiments, the control circuit 101 can be coupled to the semiconductor circuit 10 (for example, be coupled at the node N4), to receive the output signal VOUT, and can be aware if the random telegraph noise exists in the semiconductor circuit 10 by analyzing the output signal VOUT, which would be further described in the following paragraphs with reference to FIGS. 3 and 4A-4B.

Figure 2:
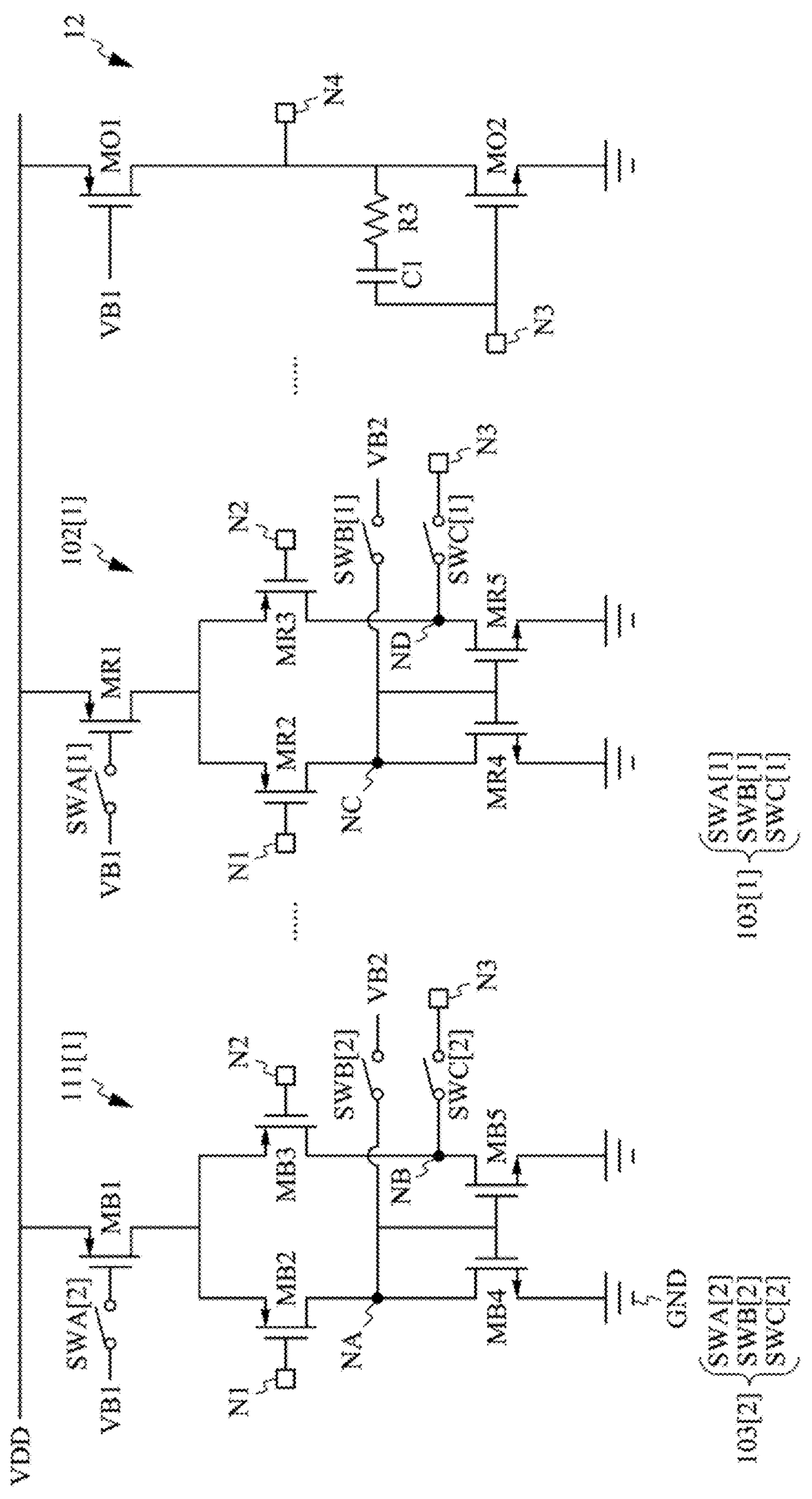
FIG. 2 is a circuit diagram of a basic circuit unit, a redundant circuit unit, a switching circuit unit and an output stage circuit in accordance with some embodiments of the present disclosure.

The redundant circuit unit 102, the switching circuit unit 103 and the basic circuit unit 111 would be further described with reference to FIG. 2. Referring to FIG. 2, FIG. 2 is a circuit diagram of the basic circuit unit 111, the redundant circuit unit 102, the switching circuit unit 103 and the output stage circuit 12 in accordance with some embodiments of the present disclosure. In some embodiments, the basic circuit unit 111[1] includes a plurality of transistors MB1-MB5. In particular, the transistors MB1-MB3 each can be implemented with N-type metal oxide semiconductor (NMOS) transistor, and the transistors MB4-MB5 each can be implemented with P-type metal oxide semiconductor (PMOS) transistor.

In some embodiments, as shown in FIG. 2, a control terminal (e.g., a gate terminal) of the transistor MB1 is coupled to a first switch SWA[2] included by the switching circuit unit 103[2], to be coupled to a bias signal VB1 through the first switch SWA[2]. A first terminal (e.g., a source terminal) of the transistor MB1 is coupled to a power signal VDD. A second terminal (e.g., a drain terminal) of the transistor MB1 is coupled to a first terminal of the transistor MB2 and a first terminal of the transistor MB3.

A control terminal of the transistor MB2 is coupled to the node N1. A second terminal of the transistor MB2 is coupled to a second terminal of the transistor MB4 at a node NA. A control terminal of the transistor MB3 is coupled to the node N2. A second terminal of the transistor MB3 is coupled to a second terminal of the transistor MB5 at a node NB.

A control terminal of the transistor MB4 and a control terminal of the transistor MB5 are coupled to the node NA. It can be seen that the control terminal of the transistor MB4, the control terminal of the transistor MB5, the second terminal of the transistor MB2 and the second terminal of the transistor MB4 are coupled together. A first terminal of the transistor MB4 and a first terminal of the transistor MB5 are coupled to a ground signal GND.

In addition, one terminal of a second switch SWB[2] included by the switching circuit unit 103[2] is coupled to the node NA, and the other terminal of the second switch SWB[2] is coupled to a bias signal VB2. One terminal of a third switch SWC[2] included by the switching circuit unit 103[2] is coupled to the node NB, and the other terminal of the third switch SWC[2] is coupled to the node N3.

Other basic circuit units 111[2]-111[6] in FIG. 1 have the circuit structure same or similar to the basic circuit unit 111[1] in FIG. 2, and therefore the descriptions thereof are omitted herein. It can be seen from the above descriptions of the basic circuit unit 111, one of the basic circuit units 111 [1]-111 [6] is coupled to the bias signal VB1, the bias signal VB2 and the input terminal of the output stage circuit 12 (i.e., the node N3) through corresponding one of the switching circuit units 103[1]-103[8].

In some embodiments, the redundant circuit unit 102[1] includes a plurality of transistors MR1-MR5. In particular, the transistors MR1-MR3 each can be implemented with NMOS transistor, and the transistors MR4-MR5 each can be implemented with PMOS transistor.

As shown in FIG. 2, a control terminal of the transistor MR1 is coupled to a first switch SWA[1] included by the switching circuit unit 103[1], to be coupled to the bias signal VB1 through the first switch SWA[1]. A first terminal of the transistor MR1 is coupled to the power signal VDD. A second terminal of the transistor MR1 is coupled to a first terminal of the transistor MR2 and a first terminal of the transistor MR3.

A control terminal of the transistor MR2 is coupled to the node N1. A second terminal of the transistor MR2 is coupled to a second terminal of the transistor MR4 at a node NC. A control terminal of the transistor MR3 is coupled to the node N2. A second terminal of the transistor MR3 is coupled to a second terminal of the transistor MR5 at a node ND.

A control terminal of the transistor MR4 and a control terminal of the transistor MR5 are coupled to the node NC. It can be seen that the control terminal of the transistor MR4, the control terminal of the transistor MR5, the second terminal of the transistor MR2 and the second terminal of the transistor MR4 are coupled together. A first terminal of the transistor MR4 and a first terminal of the transistor MR5 are coupled to the ground signal GND.

In addition, one terminal of a second switch SWB[1] included by the switching circuit unit 103[1] is coupled to the node NC, and the other terminal of the second switch SWB[1] is coupled to the bias signal VB2. One terminal of a third switch SWC[1] included by the switching circuit unit 103[1] is coupled to the node ND, and the other terminal of the third switch SWC[1] is coupled to the node N3.

The other redundant circuit unit 102[2] in FIG. 1 has the circuit structure same or similar to the redundant circuit unit 102[1] in FIG. 2, and therefore the descriptions thereof are omitted herein. It can be seen from the above descriptions of the redundant circuit unit 102, one of the redundant circuit units 102[1]-102[2] is coupled to the bias signal VB1, the bias signal VB2 and the input terminal of the output stage circuit 12 (i.e., the node N3) through corresponding one of the switching circuit units 103[1]-103[8].

It can be seen from the above descriptions of the basic circuit unit 111 and the redundant circuit unit 102 that the redundant circuit unit 102 is substantially a duplicate circuit of the basic circuit unit 111.

In some embodiments, the output stage circuit 12 includes a plurality of transistors MO1-MO2, a capacitor C1 and a resistor R3. In particular, the transistor MO1 can be implemented with NMOS transistor, and the transistor MO2 can be implemented with PMOS transistor.

A control terminal of the transistor MO1 is coupled to the bias signal VB1, a first terminal of the transistor MO1 is coupled to the power signal VDD, and a second terminal of the transistor MO1 is coupled to the node N4. A control terminal of the transistor MO2 is coupled to the node N3, a first terminal of the transistor MO2 is coupled to the ground signal GND, and a second terminal of the transistor MO2 is coupled to the node N4. Also, the capacitor C1 and the resistor R3 are connected in series between the node N3 and the node N4.

Figure 3:
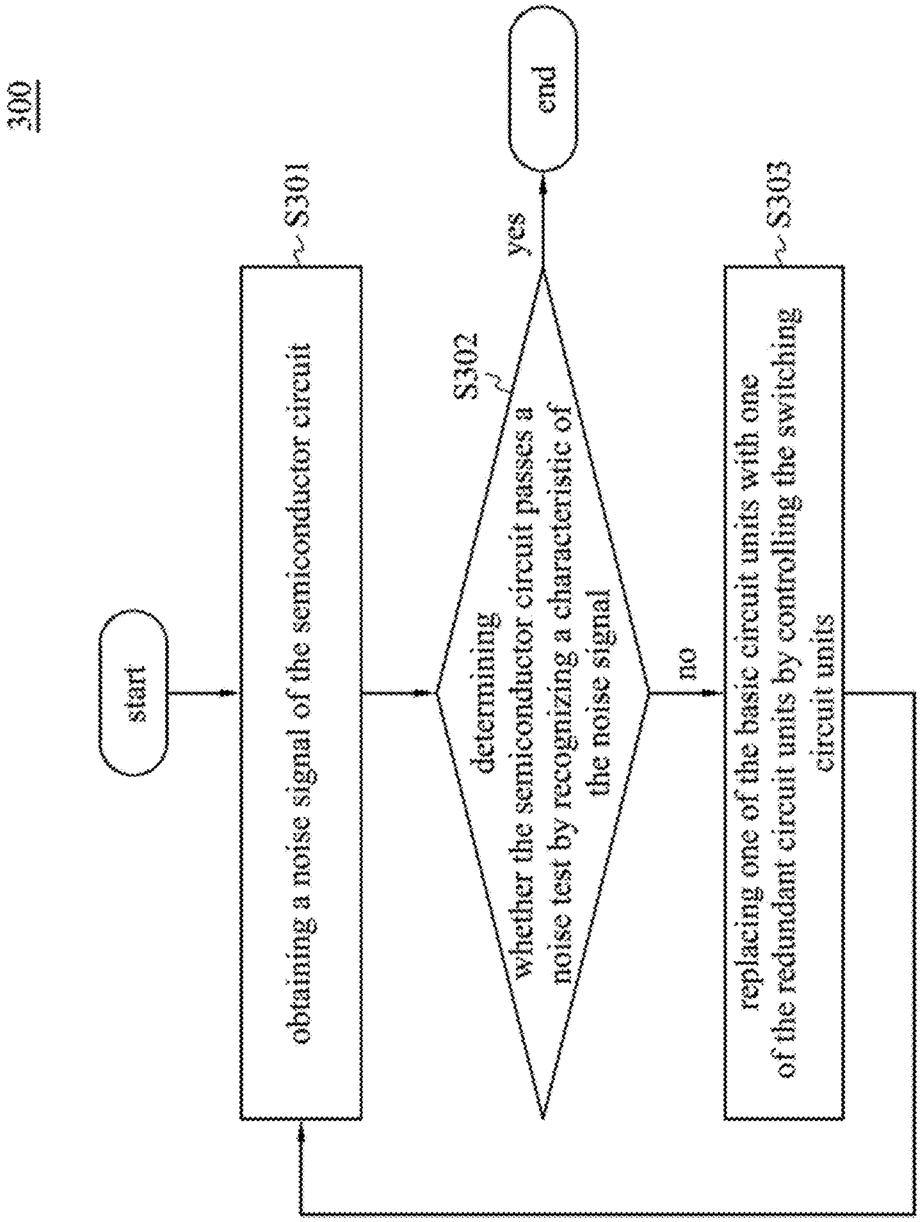
FIG. 3 is a flow diagram of a correction method in accordance with some embodiments of the present disclosure.
Figure 4A:
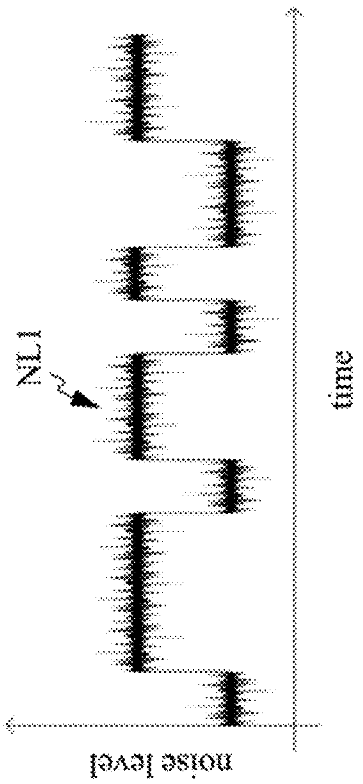
FIG. 4A is a waveform diagram of a noise signal in accordance with some embodiments of the present disclosure.

The operation of the correction system 100 would be further described then with reference to FIG. 3. Referring to FIG. 3, FIG. 3 is a flow diagram of a correction method 300 in accordance with some embodiments of the present disclosure. In some embodiments, the correction method 300 is applicable to the correction system 100 of FIG. 1. That is to say, the correction method 300 is configured to correct the semiconductor circuit 10 of FIG. 1. As shown in FIG. 3, the correction method 300 includes steps S301-S303.

In step S301, the control circuit 101 in the correction system 100 obtains a noise signal of the semiconductor circuit 10, which would be further described in the following paragraphs with reference to FIGS. 1 and 2.

In some embodiments of FIG. 1, the switching circuit units 103[2]-103[4] and 103[6]-103[8] are in an ON state, and the switching circuit units 103[1] and 103[5] are in an OFF state. In this case, the basic circuit units 111[1]-111[6] receive the bias signal VB1 and the bias signal VB2, and are connected to the input terminal of the output stage circuit 12. The redundant circuit units 102[1]-102[2] do not receive the bias signal VB1 and the bias signal VB2, and are disconnected from the input terminal of the output stage circuit 12. This is equivalent to that the semiconductor circuit 10 is operated with the basic circuit units 111[1]-111[6](or that the semiconductor circuit 10 is not operated with the redundant circuit units 102[1]-102[2]).

In some embodiments, when the semiconductor circuit 10 is operated with the basic circuit units 111[1]-111[6], as the descriptions of FIG. 1, the semiconductor circuit 10 generates the output signal VOUT according to the input signal VIN.

It should be understood that common low-frequency noises include the aforementioned random telegraph noise, thermal noise, flicker noise (or 1/f noise), etc., and these low-frequency noises may simultaneously present within a frequency range such us, 0.1-1000 Hz. Notably, the aforementioned random telegraph noise may be dominant within a specific frequency range around 0.1 Hz.

Accordingly, in some embodiments, after receiving the output signal VOUT, the control circuit 101 performs a band-pass filter processing on the output signal VOUT to generate the noise signal of the semiconductor circuit 10. In particular, the bandwidth of the band-pass filter processing may be between 0.003 and 100 Hz, so as to allow the generated noise signal to be dominated by the aforementioned random telegraph noise. It can be seen that the noise signal of the semiconductor circuit 10 is obtained by the control circuit 101 when the semiconductor circuit 10 is operated with the basic circuit units 111 [1]-111[6].

In step S302, the control circuit 101 in the correction system 100 determines whether the semiconductor circuit 10 passes a noise test by recognizing a characteristic of the noise signal. Referring to FIG. 4A, FIG. 4A is a waveform diagram of a noise signal NL1 in accordance with some embodiments of the present disclosure. As shown in FIG. 4A, a noise signal NL1 presents a characteristic of the random telegraph noise such as, infrequent, high variability, etc.

In some embodiments, the control circuit 101 can calculate a standard deviation and/or a root mean square value of the noise signal NL1, or can transform the noise signal NL1 from time domain into frequency domain by for example fast Fourier transform, to obtain the characteristic of the noise signal NL1. Then, the control circuit 101 can recognize if the characteristic of the noise signal NL1 includes the characteristic of the random telegraph noise to determine whether the semiconductor circuit 10 passes the noise test. The approach for recognizing if the characteristic of the noise signal NL1 includes the characteristic of the random telegraph noise is well known by person having ordinary skill in the art of the present disclosure, and therefore the descriptions thereof are omitted herein.

In some embodiments, when the characteristic of the noise signal NL1 includes the characteristic of the random telegraph noise, the control circuit 101 determines that the semiconductor circuit 10 does not pass the noise test. Accordingly, step S303 is executed.

In step S303, the control circuit 101 in the correction system 100 replaces one of the basic circuit units 111 [1]-111 [6] with one of the redundant circuit units 102[1]-102[2] by controlling the switching circuit units 103[1]-103[8]. Taking the embodiments of FIG. 2 as the example, the control circuit 101 switches the switching circuit unit 103[2] to the OFF state, and switches the switching circuit unit 103[1] to the ON state, so that the basic circuit unit 111[1] is replaced with the redundant circuit unit 102[1]. It should be understood that the switching circuit units 103[3]-103[4] and 103[6]-103[8] are still controlled in the ON state, and the switching circuit unit 103[5] is still controlled in the OFF state.

After step S303, the redundant circuit unit 102[1] and the basic circuit units 111[2]-111[6] receive the bias signal VB1 and the bias signal VB2, and are connected to the input terminal of the output stage circuit 12. The redundant circuit unit 102[2] and the basic circuit unit 111 [1] do not receive the bias signal VB1 and the bias signal VB2, and are disconnected from the input terminal of the output stage circuit 12. That is to say, the semiconductor circuit 10 is operated with the redundant circuit unit 102[1] and the basic circuit units 111[2]-111[6](or the semiconductor circuit 10 is not operated with the redundant circuit unit 102[2] and the basic circuit unit 111 [1]).

In some embodiments, as shown in FIG. 3, after step S303, step S301 and step S302 are sequentially executed again. It should be understood that when the semiconductor circuit 10 is operated with the redundant circuit unit 102[1] and the basic circuit units 111[2]-111[6], the semiconductor circuit 10 generates another output signal VOUT according to the input signal VIN. As the descriptions of step S301 and step S302, the control circuit 101 receives and processes (e.g., band-pass filter processing) the another output signal VOUT, to obtain another noise signal of the semiconductor circuit 10. Then, the control circuit 101 recognizes if a characteristic of the another noise signal includes the characteristic of the random telegraph noise to determine again whether the semiconductor circuit 10 passes the noise test.

Figure 4B:
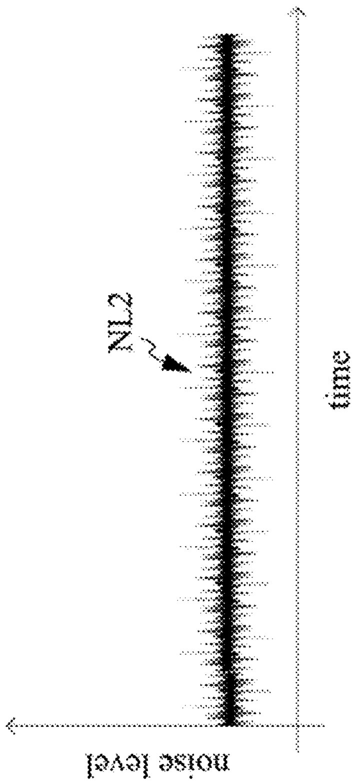
FIG. 4B is a waveform diagram of a noise signal in accordance with some embodiments of the present disclosure.

Referring to FIG. 4B, FIG. 4B is a waveform diagram of another noise signal NL2 in accordance with some embodiments of the present disclosure. As shown in FIGS. 4A and 4B, in comparison to the noise signal NL1 in FIG. 4A, the another noise signal NL2 in FIG. 4B clearly does not present the characteristic of the random telegraph noise.

In some embodiments, as shown in FIG. 3, when a characteristic of the another noise signal NL2 does not include the characteristic of the random telegraph noise, the control circuit 101 determines that the semiconductor circuit 10 passes the noise test. Accordingly, the correction method 300 is ended. Furthermore, this also indicates that the replaced basic circuit unit 111 [1] has the problem of the random telegraph noise.

It should be understood that if the characteristic of the another noise signal includes the characteristic of the random telegraph noise, step S303 would be executed again. For example, the control circuit 101 switches the switching circuit unit 103[3] to the OFF state, and switches the switching circuit unit 103[2] to the ON state. The switching circuit units 103[1], 103[4] and 103[6]-103[8] are still controlled in the ON state, and the switching circuit unit 103[5] is still controlled in the OFF state. In such way, the semiconductor circuit 10 is operated with the redundant circuit unit 102[1] and the basic circuit units 111[1]-111[2] and 111 [4]-111 [6], which is also equivalent to replacing the basic circuit unit 111 [3] instead of the basic circuit unit 111 [1] with the redundant circuit unit 102[1].

As can be seen from the above descriptions, by the correction method 300, the basic circuit unit 111 having the problem of the random telegraph noise can be found and replaced with the redundant circuit unit 102.

In some embodiments of FIG. 1, the semiconductor circuit 10 is connected as the inverting amplifier, but the present disclosure is not limited herein. For example, in some embodiments, the node N1 (i.e., the inverting input terminal of the first stage circuit 11) is directly coupled to the node N4 (i.e., the output terminal of the output stage circuit 12) without through the resistor R2, and the node N2 (i.e., the non-inverting input terminal of the first stage circuit 11) is coupled to the input signal VIN. In other words, the semiconductor circuit 10 is connected as a voltage buffer. It should be understood that when the semiconductor circuit 10 is connected as the voltage buffer, the control circuit 101 can receive an output signal, which is generated by the semiconductor circuit 10 according to the input signal VIN, from the node N4, to obtain a noise signal and to determine whether the semiconductor circuit 10 passes the noise test.

In addition, in some embodiments of FIG. 1, the control circuit 101 receives and processes the output signal VOUT generated by the semiconductor circuit 10 according to the input signal VIN, to obtain the noise signal, but the present disclosure is not limited herein. For example, in some embodiments, a resistor is coupled to the input signal VIN and the node N1, the node N2 is coupled to the reference signal VREF, and another resistor is coupled to the node N1 and the node N3. In other words, the first stage circuit 11 in the semiconductor circuit 10 composes an inverting amplifier by connecting to the aforementioned two resistors. In such arrangements, the control circuit 101 can be coupled to the node N3, and receives and processes a signal generated by the first stage circuit 11 according to the input signal VIN, to obtain a noise signal. The remaining operations are the same or similar to those of the above embodiments, and therefore the descriptions thereof are omitted herein.

Figure 5:
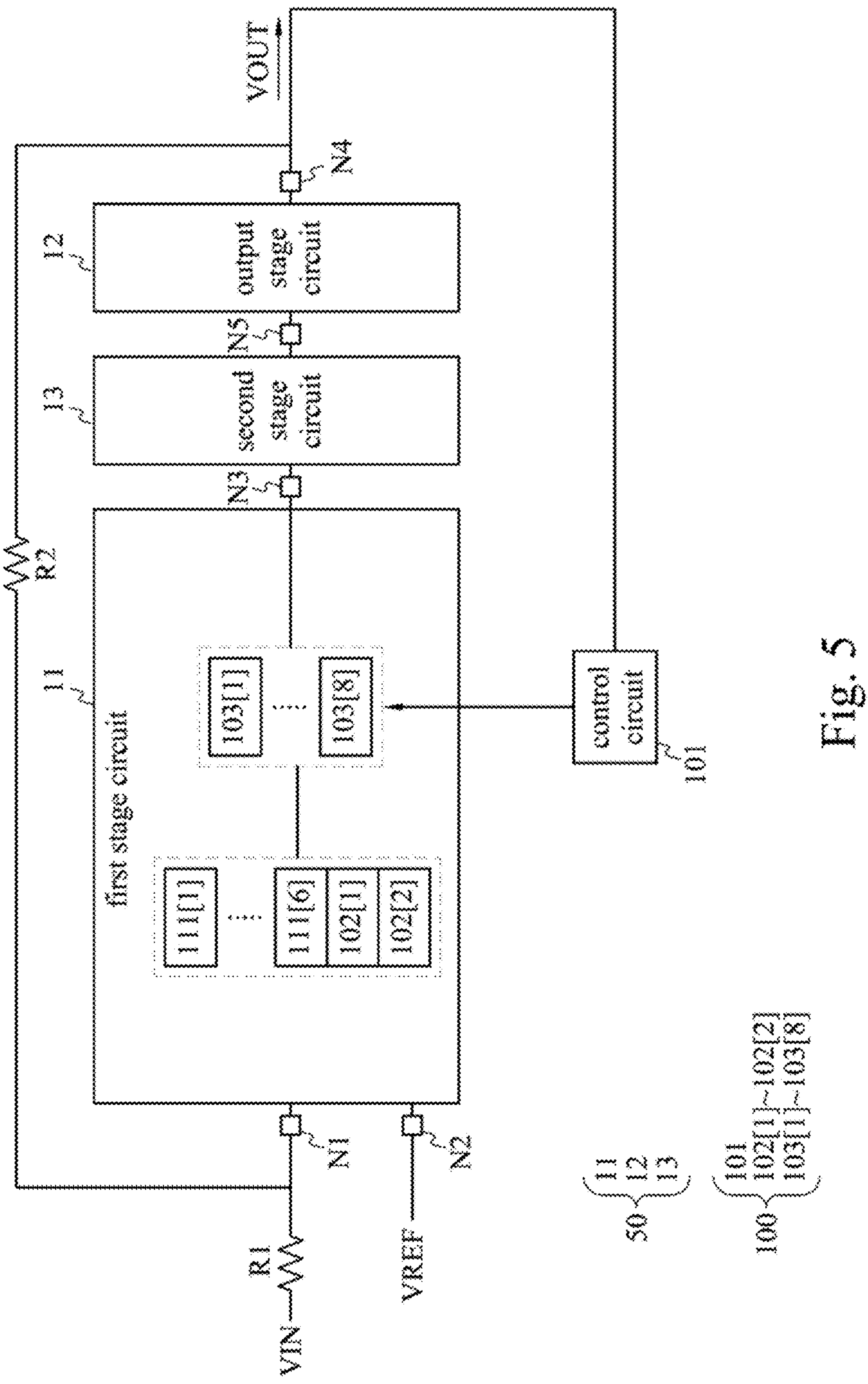
FIG. 5 is a schematic diagram of a correction system and a semiconductor circuit in accordance with some embodiments of the present disclosure.

The semiconductor circuit of the present disclosure is not limited to the circuit structure as shown in FIG. 1. For example, referring to FIG. 5, FIG. 5 is a schematic diagram of the correction system 100 and another semiconductor circuit 50 in accordance with some embodiments of the present disclosure. In comparison to the semiconductor circuit 10 of FIG. 1, the semiconductor circuit 50 further includes a second stage circuit 13 in addition to the first stage circuit 11 and the output stage circuit 12. As shown in FIG. 5, the second stage circuit 13 is coupled to the first stage circuit 11 at the node N3 (that is, the node N3 is an input terminal of the second stage circuit 13 or the output terminal of the first stage circuit 11), and the second stage circuit 13 is coupled to the output stage circuit 12 at a node N5 (that is, the node N5 is an output terminal of the second stage circuit 13 or the input terminal of the output stage circuit 12). That is to say, the second stage circuit 13 is coupled between the output terminal of the first stage circuit 11 and the input terminal of the output stage circuit 12. Other arrangements of the semiconductor circuit 50 are the same or similar to those of the above embodiments, and therefore the descriptions thereof are omitted herein.

In some embodiments of FIG. 5, the semiconductor circuit 50 is connected as an inverting amplifier so that the control circuit 101 can obtain the noise signal from the output signal VOUT generated by the semiconductor circuit 50 according to the input signal VIN, but the present disclosure is not limited herein. For example, in some embodiments, the first stage circuit 11 in the semiconductor circuit 50 is connected as an inverting amplifier, so that the control circuit 101 can obtain the noise signal from a signal generated by the first stage circuit 11 according to the input signal VIN. In some embodiments, the first stage circuit 11 and the second stage circuit 13 in the semiconductor circuit 50 can be connected as an inverting amplifier, so that the control circuit 101 can obtain the noise signal from a signal generated by the first stage circuit 11 and the second stage circuit 13 according to the input signal VIN.

In addition, in some embodiments of FIG. 5, the semiconductor circuit 50 is connected as the inverting amplifier, but the present disclosure is not limited herein. For example, in some embodiments, the node N1 (i.e., the inverting input terminal of the first stage circuit 11) is directly coupled to the node N4 (i.e., the output terminal of the output stage circuit 12) without through the resistor R2, and the node N2 (i.e., the non-inverting input terminal of the first stage circuit 11) is coupled to the input signal VIN. In other words, the semiconductor circuit 50 is connected as a voltage buffer. It should be understood that when the semiconductor circuit 50 is connected as the voltage buffer, the control circuit 101 can receive an output signal, which is generated by the semiconductor circuit 50 according to the input signal VIN, from the node N4, to obtain a noise signal and to determine whether the semiconductor circuit 50 passes the noise test.

In sum of the descriptions of the above embodiments, at least the first stage circuit 11 in the semiconductor circuit 10/50 can be connected as a circuit such as, the inverting amplifier, the voltage buffer, etc., to obtain the noise signal of the semiconductor circuit 10/50 and to determine whether the semiconductor circuit 10/50 passes the noise test.

By arranging the redundant circuit units and the switching circuit units on a portion (e.g., the first stage circuit 11), which is directly related to the noise, in the semiconductor circuit, the correction system and the correction method of the present disclosure can replace the basic circuit unit having the problem of the random telegraph noise with the redundant circuit unit, so as to have advantages of improving the performance of the semiconductor circuit.

Although the present disclosure has been described in considerable detail with reference to certain embodiments thereof, other embodiments are possible. Therefore, the spirit and scope of the appended claims should not be limited to the description of the embodiments contained herein. It will be apparent to those skilled in the art that various modifications and variations can be made to the structure of the present disclosure without departing from the scope or spirit of the invention. In view of the foregoing, it is intended that the present invention cover modifications and variations of this invention provided they fall within the scope of the following claims.

What is claimed is:

1. A correction system, configured to correct a semiconductor circuit, and comprising:

a plurality of redundant circuit units, coupled to the semiconductor circuit;

a plurality of switching circuit units, coupled to the plurality of redundant circuit units and a plurality of basic circuit units of the semiconductor circuit; and a control circuit, coupled to the semiconductor circuit and the plurality of switching circuit units, configured to obtain a noise signal of the semiconductor circuit, configured to determine whether the semiconductor circuit passes a noise test by recognizing a characteristic of the noise signal, and configured to replace one of the plurality of basic circuit units with one of the plurality of redundant circuit units by directly outputting a plurality of controls signals to the plurality of switching circuit units when the semiconductor circuit does not pass the noise test, wherein each of the plurality of controls signals is configured to switch a corresponding one of the plurality of switching circuit units into an ON state or an OFF state.

2. The correction system of claim 1, wherein the control circuit is further configured to obtain another noise signal of the semiconductor circuit when the semiconductor circuit is operated with the one of the plurality of redundant circuit units and others of the plurality of basic circuit units, and is configured to determine whether the semiconductor circuit passes the noise test by recognizing a characteristic of the another noise signal.

3. The correction system of claim 1, wherein the noise signal is obtained by the control circuit when the semiconductor circuit is operated with the plurality of basic circuit units.

4. The correction system of claim 1, wherein the control circuit is further configured to determine that the semiconductor circuit does not pass the noise test when the characteristic of the noise signal comprises a characteristic of random telegraph noise.

5. The correction system of claim 4, wherein the control circuit is further configured to determine that the semiconductor circuit passes the noise test when the characteristic of the noise signal does not comprise the characteristic of random telegraph noise.

6. The correction system of claim 1, wherein the control circuit is further configured to receive and process a signal of the semiconductor circuit to obtain the noise signal.

7. The correction system of claim 6, wherein the semiconductor circuit comprises a first stage circuit and an output stage circuit, an output terminal of the first stage circuit is coupled to an input terminal of the output stage circuit, an output terminal of the output stage circuit is coupled to an inverting input terminal of the first stage circuit, and the plurality of switching circuit units, the plurality of basic circuit units and the plurality of redundant circuit units are all arranged on the first stage circuit.

8. The correction system of claim 7, wherein a non-inverting input terminal of the first stage circuit is coupled to an input signal, and the signal is an output signal generated by the semiconductor circuit according to the input signal.

9. The correction system of claim 7, wherein a first resistor is coupled between the inverting input terminal and an input signal, a second resistor is coupled between the inverting input terminal and the output terminal of the output stage circuit, a non-inverting input terminal of the first stage circuit is coupled to a reference signal, and the signal is an output signal generated by the semiconductor circuit according to the input signal.

10. The correction system of claim 7, wherein a first resistor is coupled between the inverting input terminal and an input signal, a second resistor is coupled between the inverting input terminal and the output terminal of the first stage circuit, a non-inverting input terminal of the first stage circuit is coupled to a reference signal, and the signal is a signal generated by the first stage circuit according to the input signal.

11. The correction system of claim 7, wherein the semiconductor circuit further comprises a second stage circuit, and the second stage circuit is coupled between the output terminal of the first stage circuit and the input terminal of the output stage circuit.

12. The correction system of claim 11, wherein a non-inverting input terminal of the first stage circuit is coupled to an input signal, and the signal is an output signal generated by the semiconductor circuit according to the input signal.

13. The correction system of claim 11, wherein a first resistor is coupled between the inverting input terminal and an input signal, a second resistor is coupled between the inverting input terminal and the output terminal of the output stage circuit, a non-inverting input terminal of the first stage circuit is coupled to a reference signal, and the signal is an output signal generated by the semiconductor circuit according to the input signal.

14. The correction system of claim 7, wherein the one of the plurality of basic circuit units is coupled to a plurality of bias signals and the input terminal of the output stage circuit through one of the plurality of switching circuit units, the one of the plurality of redundant circuit units is coupled to the plurality of bias signals and the input terminal of the output stage circuit through another one of the plurality of switching circuit units, and the control circuit is configured to switch the one of the plurality of switching circuit units to an OFF state, and is configured to switch the another one of the plurality of switching circuit units to an ON state, so that the one of the plurality of basic circuit units is replaced by the one of the plurality of redundant circuit units.

15. The correction system of claim 1, wherein an amount of the plurality of redundant circuit units is less than an amount of the plurality of basic circuit units, and an amount of the plurality of switching circuit units is equal to a sum of the amount of the plurality of redundant circuit units and the amount of the plurality of basic circuit units.

16. A correction method, configured to correct a semiconductor circuit, wherein the semiconductor circuit comprises a plurality of basic circuit units, a plurality of redundant circuit units is coupled to the semiconductor circuit, a plurality of switching circuit units is coupled to the plurality of basic circuit units and the plurality of redundant circuit units, and the correction method comprises:

obtaining a noise signal of the semiconductor circuit;

determining whether the semiconductor circuit passes a noise test by recognizing a characteristic of the noise signal; and replacing one of the plurality of basic circuit units with one of the plurality of redundant circuit units by directly outputting a plurality of controls signals to the plurality of switching circuit units when the semiconductor circuit does not pass the noise test, wherein each of the plurality of controls signals is configured to switch a corresponding one of the plurality of switching circuit units into an ON state or an OFF state.

17. The correction method of claim 16, further comprising:

obtaining another noise signal of the semiconductor circuit when the semiconductor circuit is operated with the one of the plurality of redundant circuit units and others of the plurality of basic circuit units; and determining whether the semiconductor circuit passes the noise test by recognizing a characteristic of the another noise signal.

18. The correction method of claim 16, wherein the noise signal is obtained when the semiconductor circuit is operated with the plurality of basic circuit units.

19. The correction method of claim 16, wherein it is determined that the semiconductor circuit does not pass the noise test when the characteristic of the noise signal comprises a characteristic of random telegraph noise.

20. The correction method of claim 19, wherein it is determined that the semiconductor circuit passes the noise test when the characteristic of the noise signal does not comprise the characteristic of random telegraph noise.

* * * * *